US007050921B2

(12) United States Patent
Sutton

(10) Patent No.: US 7,050,921 B2
(45) Date of Patent: May 23, 2006

(54) ELECTRONIC TEST PROGRAM WITH RUN SELECTION

(75) Inventor: Christopher K Sutton, Everett, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 206 days.

(21) Appl. No.: 10/128,400

(22) Filed: Apr. 23, 2002

(65) Prior Publication Data

US 2003/0200049 A1    Oct. 23, 2003

(51) Int. Cl.
*G01R 27/28* (2006.01)
*G01R 31/00* (2006.01)

(52) U.S. Cl. ...................................... 702/120
(58) Field of Classification Search ................ 702/120, 702/117, 81, 67, 122, 123, 121; 700/17, 700/46
See application file for complete search history.

(56) References Cited

U.S. PATENT DOCUMENTS

| 5,206,582 | A | 4/1993 | Ekstedt et al. | |
| 6,401,210 | B1 * | 6/2002 | Templeton | 713/200 |
| 6,515,484 | B1 * | 2/2003 | Bald et al. | 324/551 |
| 6,577,981 | B1 * | 6/2003 | Grey et al. | 702/119 |
| 6,839,650 | B1 * | 1/2005 | Sutton et al. | 702/123 |
| 2003/0014208 | A1 * | 1/2003 | Glynn et al. | 702/120 |
| 2003/0098879 | A1 * | 5/2003 | Mathews | 345/762 |
| 2003/0163788 | A1 * | 8/2003 | Dougherty | 715/523 |
| 2003/0182601 | A1 * | 9/2003 | Richardson | 714/46 |

FOREIGN PATENT DOCUMENTS

| WO | WO 98/45720 | 10/1998 |
| WO | WO 99/47937 | 9/1999 |

OTHER PUBLICATIONS

Norton Utilities User's Guide, 2001.*
BlackICE Sentry User Guide, 2001, Version 3.0.*
Norton System Works "A step by step guide",pp. 1-8.*
PC Update Online !, Norton AntiVirus 5.0, 1999.*
On Test Norton SyatemWorks, Norton SystemWorks 2001,pp. 106-108.*
Canadian Society for the Advancement of Legal Technology,Utilities, 1999.*
McAfee VirusScan Anti-Viru Software User's Guide Version 4.5, 2000.*
Norton AntiVirus for Macintosh User's Guide, Norton AntiVirus 7.0, 2001.*
National Instruments, "TestStand—A Complete Test Executive Environment," National Instruments, p. 55-60 (Mar., 2000).
Hansen, Peter, "The World Wide Web Leads a Revolution in ATE Programming Environments", 1997 Autotestcon Proceedings: IEEE Systems Readiness Technology Conference, Anaheim, CA, US, Sep. 22-25, 1997, Autestcon Proceedings: IEEE Systems Readiness Technology Conference, New York, IEEE, US, vol. Conf. 33, Sep. 1997, pp. 165-169, XP002107206 ISBN: 0-07803-4163-5.

* cited by examiner

*Primary Examiner*—John Barlow
*Assistant Examiner*—Demetrius R. Pretlow

(57) ABSTRACT

A test executive system that allows running of selected tests. A graphical user interface allows the user to run all tests, run marginal and failed tests, or to run only selected tests. When the "run selected tests" option is selected, check boxes appear on a procedure tree. Selected Procedures, Tests, Measurements and Datapoints may then be selected by checking on a box and deselected by checking the box a second time. A check appears in selected boxes. The brightness of a checked box indicates how many lower level items are checked. The selected Procedures, Tests, Measurements and Datapoints can be saved and recalled.

28 Claims, 8 Drawing Sheets

ELECTRONIC TEST PROGRAM WITH RUN SELECTION

BACKGROUND OF THE INVENTION

Complex electronic, electromechanical and mechanical devices are generally tested using automated test systems. The tests may include validation tests, which run through various operations of a device under test (DUT) and record whether each operation was performed properly. The tests may also include environmental tests, which expose the DUT to various combinations of temperature, pressure, and humidity to record the results of operations as the environment changes. Other tests, such as production tests, may also be completed. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Test executive programs in the prior art include internal test executive programs developed by Agilent Technologies and TESTSTAND software developed by National Instruments Corporation, which is described as a ready-to-run test executive for organizing, controlling, and executing automated prototype, validation, or production test systems. The prior art Agilent Technologies programs did not use a graphical user interface (GUI), therefore limiting the ability of the program to display large amounts of data in a simple fashion. The TESTSTAND software, while using a GUI, requires the user to scroll through multiple windows to determine the overall progress of a test and therefore does not lend itself to ease of test reconfiguration.

Tests usually are defined by a set of rules or specifications to which the DUT is compared. The rules or specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test includes many combinations of the parameters applied to each element of the DUT, and often will be repeated many times. Each combination of parameters will define a measurement that results in one or more datapoints, which are recorded and compared to numerical or Boolean limits defining the specifications. Thus, as devices become more complex, electronic test programs have become very long and complex, often requiring several days, or even a week or more to run a complete test.

It is a problem that users sometimes want to only run certain procedures or tests on a DUT. For example, a user may want to verify results of some tests after the tests have been completed. Specifically, a user may view the results of test performed on a DUT and learn that some tests have failed or marginally failed. The user may then desire to perform the tests a second time to verify the results or find the reason that the test failed. In the prior art systems, the only way to perform a specific test or procedure a second time was to perform the entire test a second time. This is very time consuming and may not isolate the cause of the failure.

SUMMARY OF THE INVENTION

The above and other problems are solved and an advance in the art is made by an electronic test program with run selection in accordance with this invention. A first advantage of run selection is that a user has the ability to execute only those procedures and tests that are of interest to the user without having to execute the entire test.

A second advantage of this invention is that a user has the ability to select test portions that have failed and/or marginally failed. This allows a user to easily re-test these portions of the test.

Preferably, the invention provides the user to select a run selection choice from a plurality of run selection choices comprising at least two of the choices selected from the group consisting of "run all tests", "run marginal tests", "run failed tests"; "run erroneous tests", "run selected tests", and combinations thereof.

The present invention is an application executed by a processing unit. One skilled in the art will recognize that instructions for the application may be stored in a memory as software instructions and/or as firmware in a memory affixed to a processing chip. In accordance with this invention, a processing unit executes a routine in the following manner to provide run selection for a test executive program. First, the test program executed by the processing unit displays at least one run selection choice. The test program then receives an input of identifying one of the at least one run selection choices. The test program then executes the tests indicated by the input of the at least one run selection choice and results are displayed.

When an input is received, the test executive program determines which one of the at least one run selection choices is indicated by the user. One such run selection choice is "run all tests." When a choice of "run all tests" is received, the test executive program retrieves all tests that are stored and executes all the tests retrieved.

A second choice for run selection is preferably "run marginal and failed tests". Marginal tests are tests having measured datapoints that are near the specification limits given for the test. Failed tests are tests having measured datapoints that are outside the specification limits given for the test. When a "run marginal/failed tests" choice is received, the test executive program determines which tests have already been executed and were marginal and/or failed. The test executive program preferably then stores the marginal/failed tests in a file for future reference of tests that are being executed by the run selection. The marginal/failed tests are then executed and the results of the executed tests are then displayed.

A third choice for run selection is preferably "run selected tests". When a test executive program receives receive a "run selected tests" choice, the test executive program then receives selections of tests to run from a user and executes the selected tests. To receive the selections, the test executive program preferably displays the tests available to be selected. In a preferred embodiment, this display of tests is preferably accomplished by adding check boxes next to the tests in a tree display on a Graphic User Interface (GUI).

The test executive program then receives an input of a test to run and updates a list of tests to run by adding the input test. The test executive program then updates a display to indicate the input test is selected. In a preferred embodiment, the display is updated by adding a check mark or "x" to a check box next to a test.

When the user is finished selecting tests, the test executive program receives an input from the user indicating the user is finished selecting tests. In a preferred embodiment, the input is preferably a click on a "run" button. The list of tests to run is preferably then saved for future use. The test executive program then executes the selected tests.

In accordance with the present invention, the test executive program preferably also allows a user to remove tests from the list of tests to be executed. The removal of tests is preferably accomplished in the following manner. The test executive program receives an input indicating a test to remove from the list of tests. In a preferred embodiment, the input is preferably a click on a checkbox having a check in the box.

In response to receiving the input of the test to remove, the test executive program removes the input test from the list of tests to be executed. The test executive program then updates a display to indicate the test is removed from the list of tests to be executed. In a preferred embodiment, the display is updated by removing a check or an "x" from a checkbox next to the test.

Preferably, the test executive system has a hierarchical structure including a plurality of test levels, each higher test level comprising one or more lower test levels, and the system further comprises a display showing an indicator corresponding to each the higher test level, the indicator indicating how many of the lower test levels have been or are to be executed. Preferably, the test levels include a Procedure level, a Test level, a Measurement level, and a Datapoint level.

The test executive system according to the invention allows a user to quickly select important categories of tests to be run, and to customize these categories as desired.

BRIEF DESCRIPTION OF THE DRAWINGS

The above and other features of this invention are set forth in the detailed description below and the following drawings.

DETAILED DESCRIPTION

Figure 1:
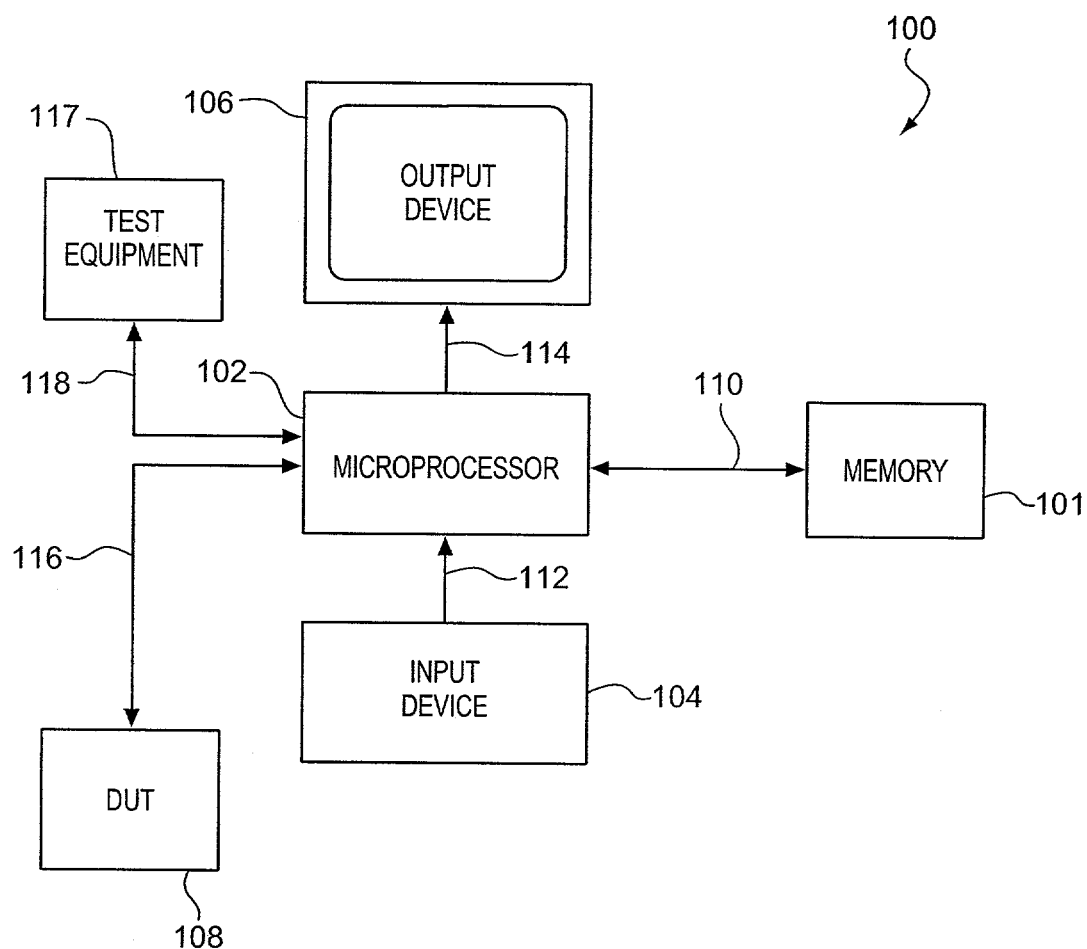
FIG. 1 illustrates a block diagram of hardware components that execute an electronic test program of a preferred embodiment of the present invention.

The present invention relates to an electronic test executive program. FIG. 1 illustrates a computer system 100 that executes a test executive program in accordance with this invention. Computer system 100 includes memory 101, microprocessor 102, input device 104 and output device 106. Memory 101 connects to microprocessor 102 via path 110. Memory 101 may be a non-volatile memory such as a Read Only Memory (ROM) or a volatile memory such as a Random Access Memory (RAM). Input device 104 connects to microprocessor 102 via path 112. Input device 104 may be keyboard, mouse, joystick, or any other device and software driver that allows a user to input data.

In a preferred embodiment, the test executive program of this invention is stored as instructions in memory 101. Those skilled in the art will recognize that the instructions may either be stored as computer software and/or firmware that is readable and executable by microprocessor 102. The results for the tests performed by the test executive program are displayed on output device 106. Output device 106 is a display and associated drivers that allow an application to display images to a user. Those skilled in the art will recognize that the display may be a conventional cathode ray monitor or Liquid Crystal Display (LCD). The actual display used does not matter for purposes of this invention.

Microprocessor 102 executes the test executive program of this invention. Microprocessor 102 communicates with a Device Under Test (DUT) 108 via path 116. Processor 102 controls test equipment 117 via electrical line 118. Signals received via paths 116 and 117 by microprocessor 102 are saved in memory 101.

One skilled in the art will recognize that this invention may be implemented by any electronic device having the same general configuration outline in FIG. 1. These electronic devices include, but are not limited to, a computer system, logic circuits embedded in hardware, and an electronic analyzer.

Figure 2:
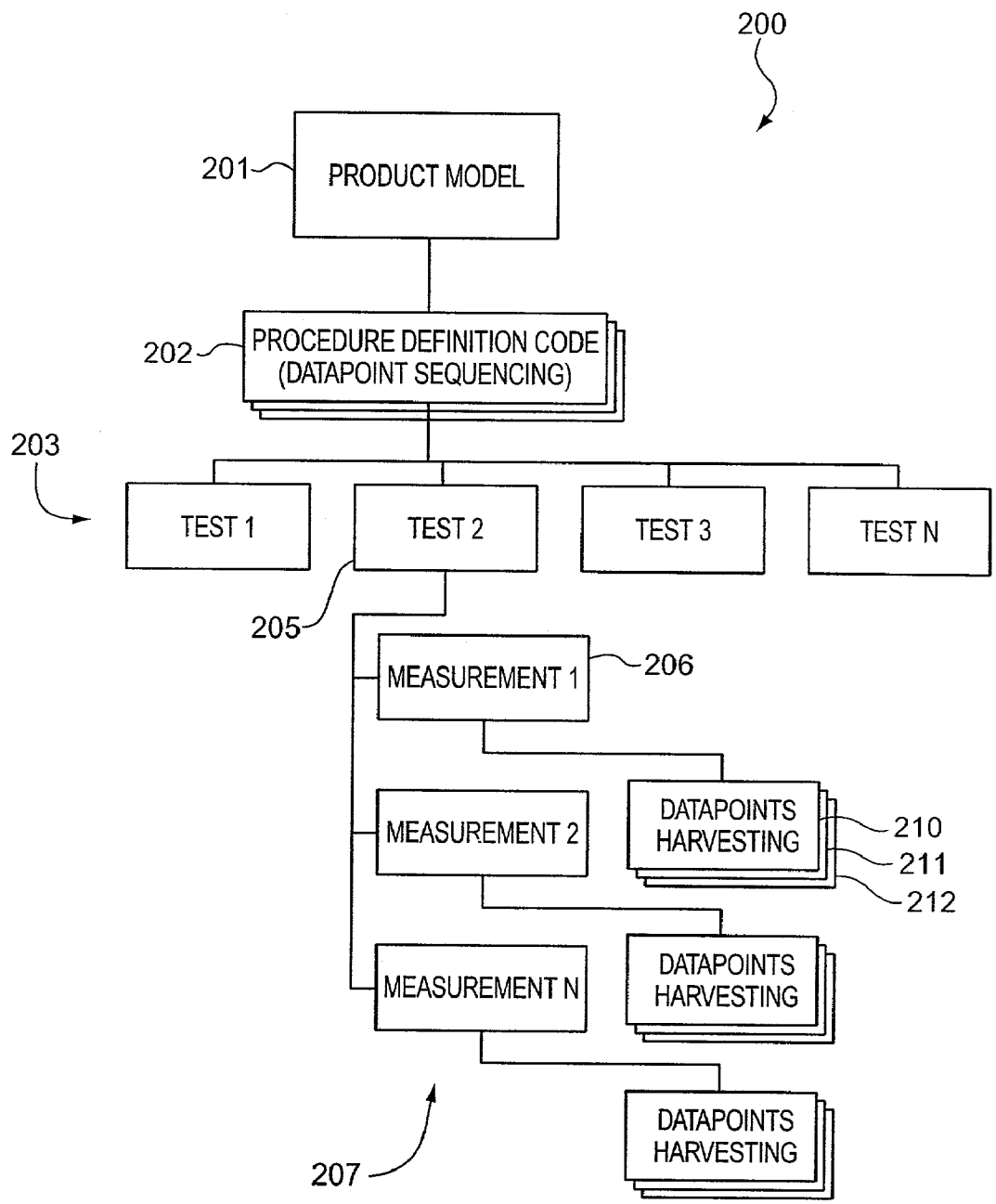
FIG. 2 illustrates a block diagram showing a hierarchical structure of a test executive program in accordance with this invention.

To better understand this invention, a hierarchical structure of a test executive program is described in FIG. 2. Block diagram 200 illustrates the preferred hierarchical, multi-level structure of the test executive program according to the invention.

First level 201 corresponds to a Product Model, which is a file that a test developer creates to test a family of specific device model numbers. This file contains test Procedures and inputs. Second level 202 is a group of Procedures. A Procedure is an ordered list, sequence, or script of tests to be run on a device. Several Procedures may exist, which is illustrated in FIG. 2 by a deck of cards 202, each representing a different Procedure. Test 203 is the next level that includes Tests 1-N to be run in each Procedure 202. Each Test 203 in turn includes a plurality of Measurements 207 to be taken during a test 203. For example, test 205 includes Measurements 206. Each Measurement 1-N includes one or more datapoints 214. For example, Measurement 206 includes datapoints 210–212. In this disclosure, when one of the levels of the hierarchy is indicated, the level is capitalized. When a word, such as "test", is not capitalized, it has a generic meaning that can include Procedures, Tests, Measurements, and Datapoints, or any other operation generally known as a "test" in the art.

Each procedure 202 is defined by a written program or a code used to build a structure of software objects. In one embodiment, the software objects are component object model, or COM, objects. COM is a language independent component architecture, not a programming language. COM is meant to be a general purpose, object-oriented structure to encapsulate commonly used functions and services.

A test 203 is a group of measurements in a procedure 202 that share a common testing algorithm or the same test software code. Some examples of tests 203 include, but are not limited to, an amplitude accuracy test, a test of harmonic distortion. Test executive program 200 repeatedly calls a test for each measurement and datapoint.

A measurement 207 is a configuration or a set up of a test. Each measurement 207 within a test 203 can have different setup or configuration parameters. Tests 203 are parameter driven. Parameters are inputs at a measurement level. Measurements 206 are elements such as range in volts, frequency in kilohertz, or a harmonic (an integer number).

Each procedure 202 uses measurements 207 as data to be passed from the procedure to a test. A measurement is also a phase of execution. During a measurement phase of execution of a test 203, a measurement 207 is started but data is not collected. Therefore, multiple DUTs 108 may be configured and tested concurrently.

Datapoints 210–212 are a subset of a measurement. These datapoints 210–212 include additional parameters that select a result when one measurement generates multiple results. For example, a measurement may have minimum and maximum datapoints for a spectrum analyzer sweep or different datapoints for each channel of a device. For each datapoint 210–212, a value result is determined. The value result is then compared to specification results. Specification results may include numerical limits, string match, and/or Boolean pass/fail results. There may be three different types of numerical limits including marginal limits, line limits, and customer limits. Each limit has an upper value and a lower value.

Figure 3:
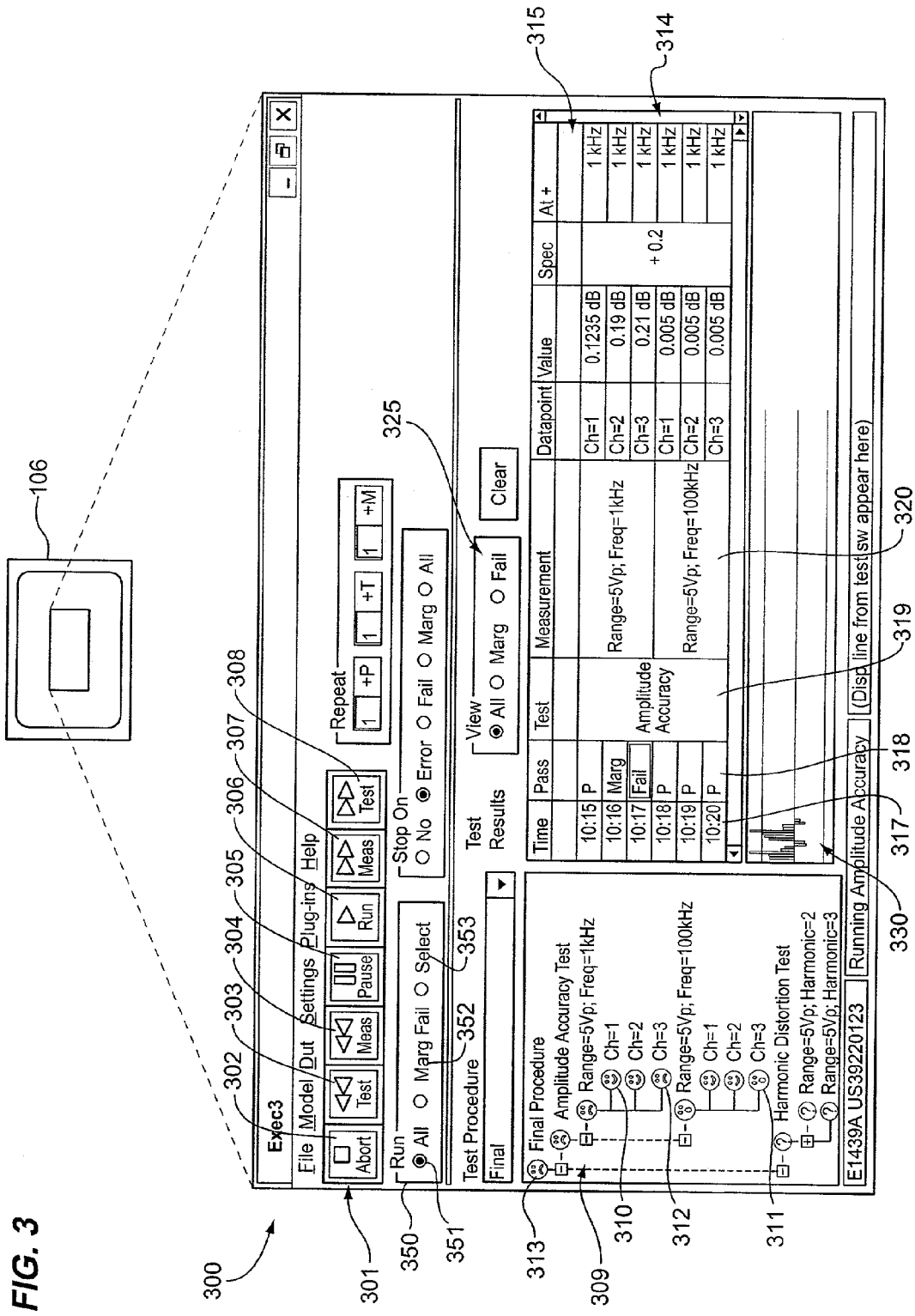
FIG. 3 illustrates a view of a graphical user interface of an electronic executive test program and an interactive dialog box of the present invention.

All inputs and outputs of computer system 100 (FIG. 1) executing a test executive program are handled through a Graphical User Interface (GUI). FIG. 3 illustrates a GUI 300 as displayed by output device 106 in accordance with a test executive program of this invention. GUI 300 includes buttons 301 that are used to control a test. For convenience of the user, buttons 301 have indicia that indicate the function served by a button. For example, buttons 301 appear as tape recorder buttons in accordance with a preferred embodiment of this invention. In the preferred embodiment, these buttons include abort button 302, restart test button 303, restart measurement button 304, pause button 305, run button 306, skip measurement button 307, and skip test button 308. One skilled in the art will recognize that while tape recorder symbols are used in this embodiment, any number of different indicia may be used to identify buttons 301.

Area 314 on the right side of GUI 300 in the preferred embodiment is a display of test results. In the preferred embodiment, area 314 includes a series of rows 315 and columns 316 displaying results of individual tests. Column 317 indicates the time that a test is executed. Column 318 displays a status of a test. Column 319 also displays a name of a test. For example, one test is an amplitude frequency. Column 320 indicates a type of measurement being taken during a test. For example, range=5 Vp; frequency=1 kHz. Column 321 displays the channel or datapoint under test. For example, ch=1 or ch=2. Column 322 displays a value or result of the test for a channel or datapoint. Column 323 displays a specification, such as +0.2. Column 324 displays a parameter such as 1 kHz.

Buttons 325 facilitate the sorting of displayed tests to allow a user to view desired tests. In the preferred embodiment, buttons 325 include an all button, a marginal pass button, and a fail button. However, one skilled in the art will recognize any number of additional ways to view the data may be added. Area 330 displays a progress bar that represents progress of a procedure being executed.

In the preferred embodiment, area 309 illustrates a test tree 313 that represents the tests being performed in a procedure area 309 which includes a hierarchy of tests, measurements, and datapoints. Test tree 313 includes icons that indicate a status of a test. The icons indicate pass, fail, marginal, and not-yet tested. In a preferred embodiment, a "smiley face" indicates a pass, a "surprised face" indicates a marginal pass, and a "frowning face" indicates a fail. The icon for the procedure indicates the status of the entire procedure, while icons for each test represent the status of an individual test. The icon for the procedure is determined by an algorithm that promotes the least optimal result. Thus, if one test fails, the procedure fails.

In accordance with this invention, GUI 300 includes run selection dialog box 350. Run selection dialog box 350 provides the user at least one run selection choice that a user may choose to run tests in accordance with this invention. In a preferred embodiment, the choices for run selection are given by a short name with a button next to the name. A user then uses a mouse or other pointing device to click a button to select a run selection choice. According to the invention, the run selection choices are preferably at least two of the choices selected from the group consisting of "run all tests", "run marginal tests", "run failed tests"; "run erroneous tests", "run selected tests", and combinations thereof. Erroneous tests are tests that have returned an error in the test setup or the executive test system as opposed to failures of the device under test. In the preferred embodiment, the choices for run selection include "all", "marginal/failed", and "select". The "all" choice means run all tests and may be selected by clicking on button 351. The "marginal/fail" choice runs all tests that have marginal results or have failed in accordance with the rules set forth above, and may be selected by clicking on button 352. The "select" choice allows a user to select those tests, procedures and datapoints that a user wants to perform. The "select" choice may be chosen by clicking on button 353.

Figure 4:
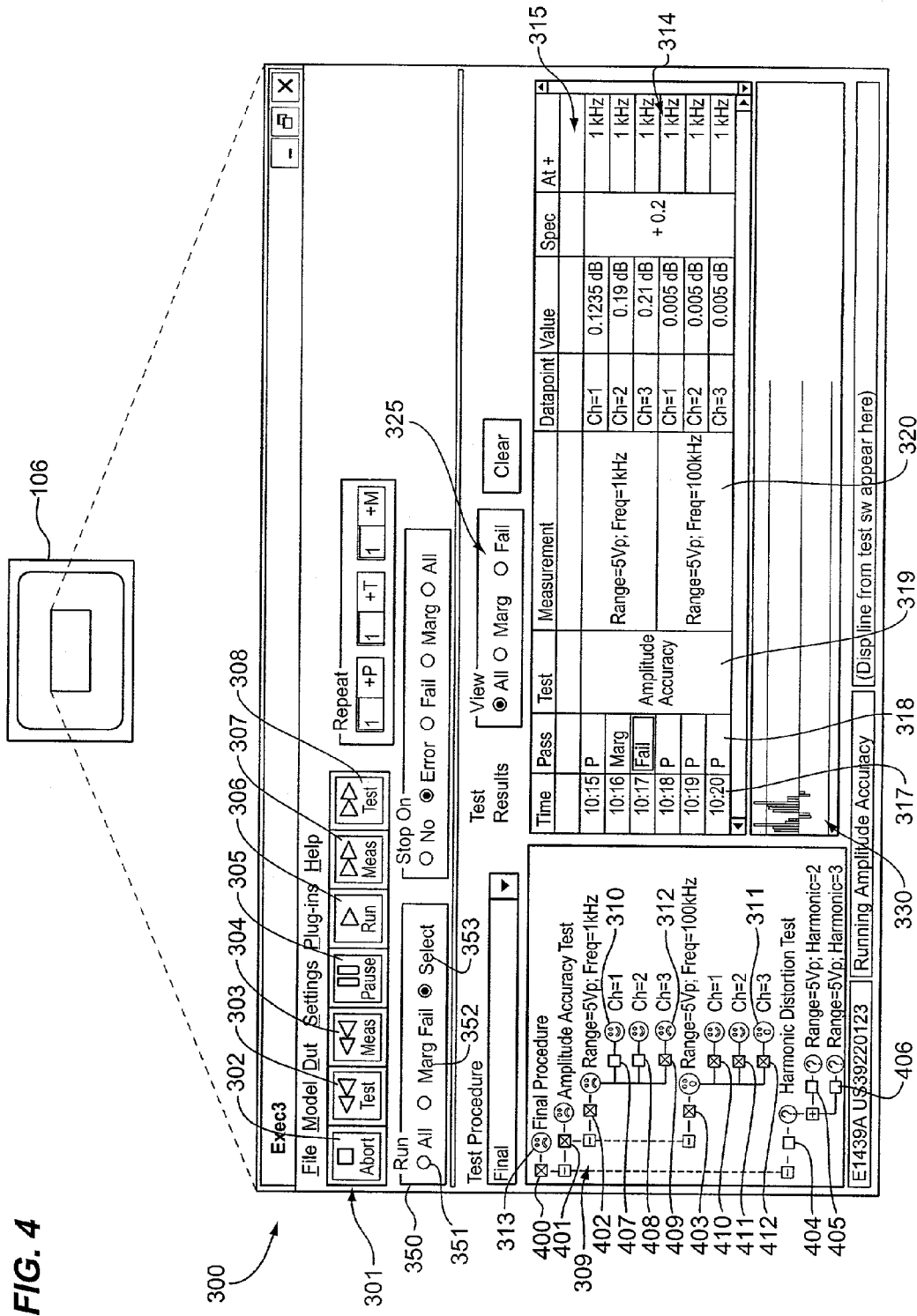
FIG. 4 illustrates a view of a graphical user interface of an electronic test executive program with test selection capability in accordance with a preferred embodiment of this invention.

When "select" is chosen, the test executive program provides a system and method for the user to select the test, procedures and datapoints to perform. FIG. 4 illustrates a manner of selecting tests, procedures and datapoints in a preferred embodiment. In the preferred embodiment, checkboxes 400–412 appear along a left side of test procedures, and datapoints in tree 313. A user then selects the test, procedures and datapoints to test by clicking on a box 400–412 with a pointing device such as a mouse. When a test is selected, a symbol such as an "x" or a check mark is placed in the box to indicate that the test, procedure, or datapoint to the immediate right is selected. A user may remove a datapoint, procedure, or test from the selected items. An item may be removed by clicking on the check box 400–412 of the item that is marked. The item is then removed from a list of items to execute and the "x" or check mark is removed from the box.

For example, check box 401 represents an amplitude accuracy test. In FIG. 4, the amplitude accuracy test has failed and a user has indicated that "select tests" should be run by clicking on button 353. The user has selected check box 401 to execute the amplitude accuracy test. The user also has checked boxes 402 and 403 to measure the range of 5 Vp at 1 kHz and 100 kHz. The user has also selected boxes 409–412.

Each level also includes an indicator of how many items at lower levels have been checked. This allows the user to quickly summarize and evaluate the overall test that has been selected. In the preferred embodiment, the brightness of a checked box indicates how many lower level items are checked. For example, box 403 is at maximum brightness since all items in the levels below it have been checked. Box 402 is of intermediate brightness because only one of the lower levels have been checked, and box 404 is not checked because no levels below it have been checked. Selecting or removing an item in the hierarchy of tests, measurements, and datapoints automatically selects or removes all lower level items. For example, selecting box 404 will also select boxes 405 and 406.

Figure 5:
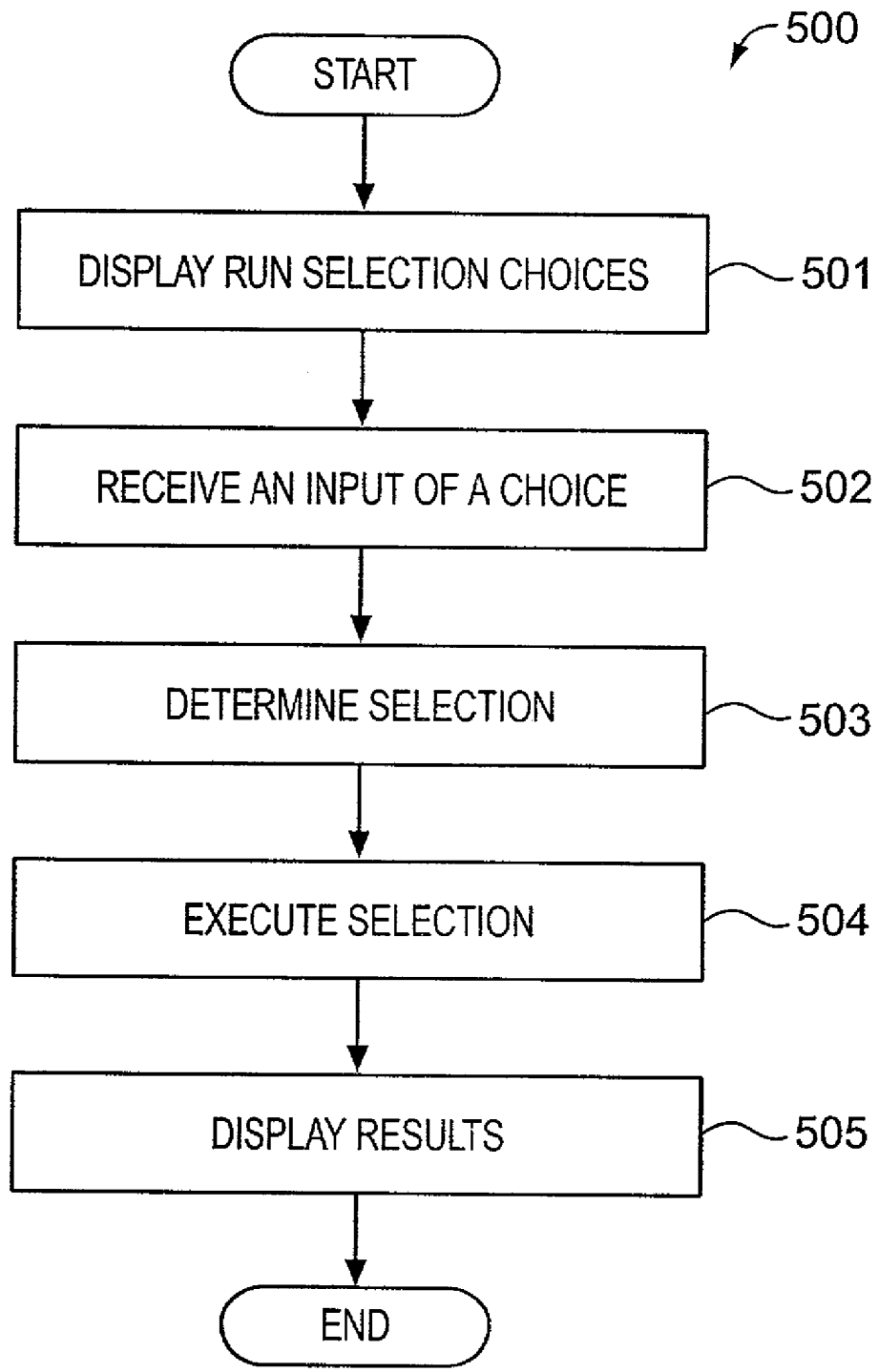
FIG. 5 illustrates a flow diagram of a routine for providing run selection in accordance with this invention.

FIG. 5 illustrates a flow diagram of a process included in the test executive program to provide run selection in accordance with this invention. One skilled in the art will recognize that any number of different programming languages may be used to generate the processes of this invention and the choice of programming language is left to those skilled in the art that are designing a test executive program that includes this invention. Process 500 begins in act 501 by displaying choices for run selection. Referring to FIG. 3, the display of selection dialog box 350 is a display of choices, although one skilled in the art will recognize that the display of choice for run selection may be shown in any one of a number of different ways including, but not limited to, a pop-up dialog box, or a pull-down menu on a toolbar.

In act 502, process 500 receives an input of a choice by a user. In the preferred embodiment, process 500 receives an input by a user clicking on a button 351-353. However, one skilled in the art will recognize that the input may also come from typing a command, selecting an option from a pull-down menu, or any of a number of other methods.

Figure 7:
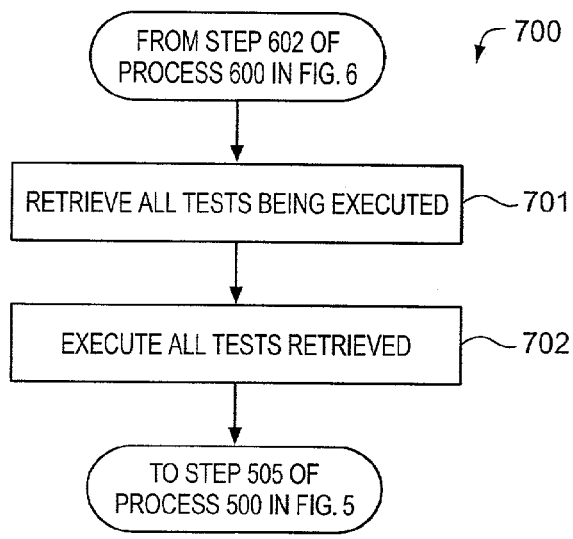
FIG. 7 illustrates a flow diagram of a routine for handling a selection of "run all tests" in accordance with a preferred embodiment of this invention.
Figure 8:
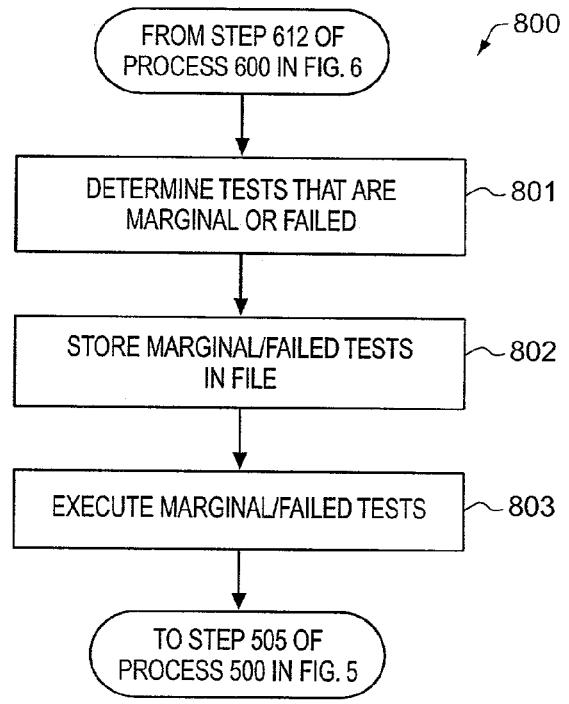
FIG. 8 illustrates a flow diagram of a routine for handling a selection of "run marginal/failed tests" in accordance with a preferred embodiment of this invention.
Figure 9:
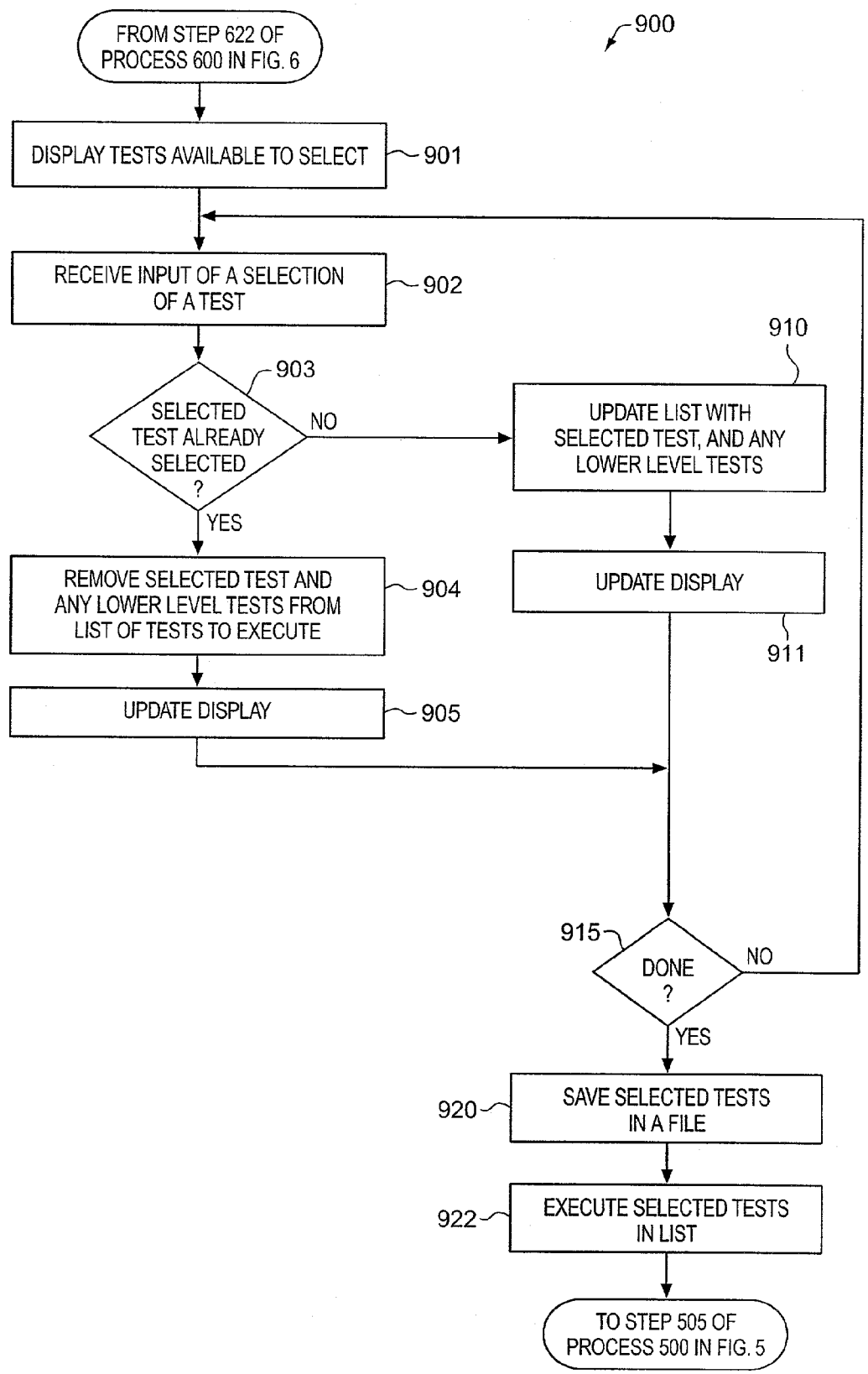
FIG. 9 illustrates a flow diagram of a routine for handling a selection of "run selected tests" in accordance with a preferred embodiment of this invention.

After an input is received, process 500 determines the selection of tests to be run in act 503. This may be completed by determining the tests that belong in a category, or receiving subsequent inputs from a user in act 503. A preferred embodiment of act 500 is shown in process 600 described below and shown in FIG. 6. The items then determined to be in the selected category are executed in act 504. Preferred embodiments of the determining act 503 are shown in FIGS. 7–9. Process 500 then, in act 505, displays the results for the items executed, and then ends.

Figure 6:
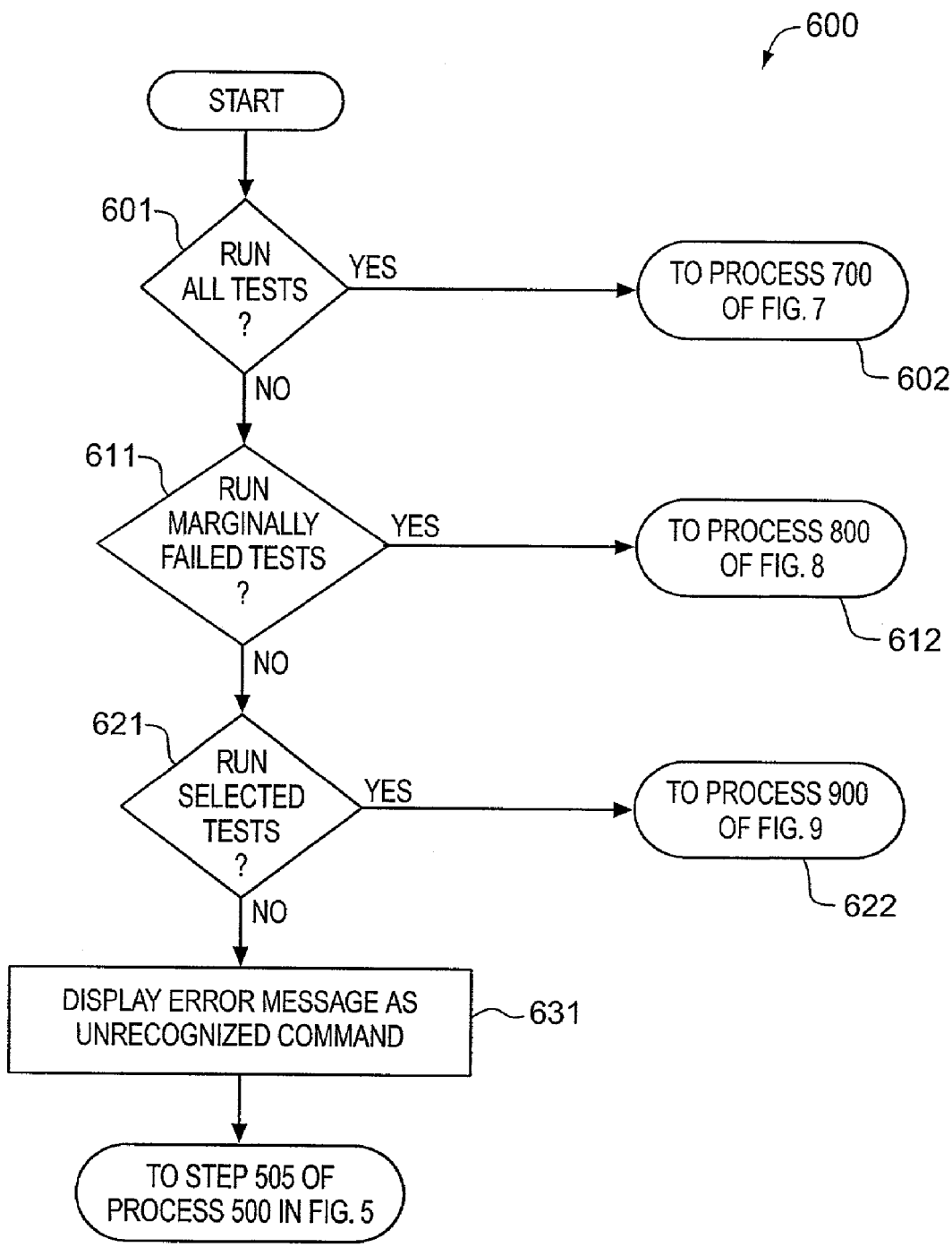
FIG. 6 illustrates a flow diagram of a routine for determining a selected type of run selection in accordance with a preferred embodiment of this invention.

FIG. 6 illustrates a preferred embodiment of a process 600 that determines the type of run selection chosen by a user. Process 600 begins in act 601 by determining whether "run all tests" is selected. If "run all tests" is selected, process 600 continues by executing process 700 shown in FIG. 7 in act 602.

If "run all tests" is not selected, process 600 determines whether "run marginal/failed tests" is selected in act 611. If "run marginal/failed tests" is selected, process 600 executes process 800 shown in FIG. 8 in act 612. If "run marginal/failed tests" is not selected, process 600 determines whether "run selected tests" is selected in act 621. If "run selected tests" is selected, process 600 executes process 900 shown in FIG. 9 in act 622. In act 631, an error message is displayed when a command is not recognized by the test executive. At this point, one skilled in the art will recognize any number of other run selection choices may be added. Some examples of other choices include, but are not limited to, "run marginal tests", "run failed tests", and "run all successful tests". It should also be noted that any of the shown run test choices may also be removed.

FIG. 7 illustrates a process 700 that determines and executes items in response to receiving a "run all tests" selection in a preferred embodiment. Process 700 begins in act 701 by retrieving all of the tests, procedures and datapoints in a test tree 313. In act 702, process 700 ends by executing all of the retrieved items. Process 700 then returns to act 505 of process 500 in FIG. 5.

FIG. 8 illustrates a process 800 that determines and executes items in response to receiving "run marginal/failed tests" in a preferred embodiment. Process 800 begins in act 801 by determining all test procedures and datapoints that are marginal or failed. The determined items are then stored in a user run selection test file in act 802. The items are stored for future use, such as executing all the items at a subsequent time. The items are then executed in act 803 and process 800 ends. Process 800 then returns to act 505 of process 500 in FIG. 5

FIG. 9 illustrates a process 900 that receives selections of items from a user in response to receiving a "run selected tests" selection in a preferred embodiment. Process 900 begins in act 901 by displaying the items that may be selected. As described above, the display is check boxes 401–406 next to items in test tree 313 in a preferred embodiment.

In act 902, process 900 receives a selection of an item. In a preferred embodiment, a selection is received by user that uses a pointer to select a check box. When a selection is received, process 900 determines whether the item is already selected in act 903.

If the item is not already selected, process 900 updates items to execute list in act 910. Process 900 then updates a display in act 911 to indicate the item is selected. In a preferred embodiment, the update includes adding a check mark or "x" to the check box next to the item. Process 900 then determines whether the user is done in act 915. If the user is not done selecting items, process 900 repeats from act 902. Otherwise, process 900 continues to act 920.

If the item is determined to already be selected in act 903, process 900 removes the item from the list of items to execute in act 904 and updates a display in act 905. In a preferred embodiment, the display is updated by removing the check mark or "x" from the check box for the item. Process 900 then determines whether the user is done and has clicked the "run" button in act 915. If the user is not done selecting items, process 900 repeats from act 902. Otherwise, process 900 continues to act 920.

In act 920, process 900 stores the list of items to be executed in a file for future use in selecting tests. The selected tests are then executed in act 922. Process 900 then ends and returns to act 505 of process 500 shown in FIG. 5.

The above is a description of an electronic test program with run selection. It should be understood that only an exemplary preferred embodiment has been disclosed, and that, now that this has been disclosed, those skilled in the art can design alternative electronic test programs with run selection that infringe this invention as set forth in the claims below either literally or through the Doctrine of Equivalents.

What is claimed is:

1. A product that provides a test executive system for controlling tests upon a device under test that is distinct and separate from said test executive system said product comprising:

instructions for directing a processing unit to:

display a plurality of run selection choices, each said run selection choice corresponding to a different set of tests: said plurality of run selection choices comprising at least two of the choices selected from the group consisting of "run all tests", "run marginal tests", "run failed tests"; "run erroneous tests', "run selected tests", and combinations thereof;

receive an input identifying one of said run selection choices;

determine whether said run selection choice is "run marginal/failed tests";

determine whether said run selection choice is "run selected tests";

determine whether said run selection choice is "run all tests";

execute tests of said device under test indicated by said run selection choice; display results of said executed tests; and the product further comprising a media readable by said: processing unit that stores said instructions; and wherein said instructions to receive said input comprises: instructions for directing said processing unit to:

display tests available to run;

receive test input corresponding to one or more of said available tests; and update a list of tests to run.

2. The product of claim 1 wherein said instructions to update comprise instructions for directing said processing unit to update a display to indicate said test is selected.

3. The product of claim 1 wherein said instructions to update further comprises instructions for directing said processing unit to save said list of tests in a file responsive to receiving said finish input.

4. The product of claim 1 wherein said instructions to receive test input further comprises:

instructions for directing said processing unit to:

receive a remove input to remove said test from said list; and remove said test from said list responsive to receiving said remove input.

5. The product of claim 4 wherein said instructions to receive remove input further comprises instructions for directing said processing unit to update a display to indicate said test is removed from said list.

6. The product of claim 1, wherein said plurality of run selection choices comprises at least three of the choices selected from the group consisting of "run all tests", "run marginal tests", "run failed tests"; "run erroneous tests', "run selected tests", and combinations thereof.

7. A product that provides a test executive system for controlling tests upon a device under test that is distinct and separate from said test executive system, said product comprising:

instructions for directing processing unit to:

display a plurality of run selection choices, each said run selection choice corresponding to a different set of tests; said plurality of run selection choices comprising at least two of the choices selected from the group consisting of "run all tests", "run marginal tests", "run failed tests"; "run erroneous tests", "run selected tests", and combinations thereof;

receive an input identifying one of said run selection choices;

determine whether said run selection choice is "run marginal/failed tests";

execute tests of said device under test indicated by said run selection choice;

display results of said executed tests; and a media readable by said processing unit that stores said instructions; and wherein said controlled test has a hierarchial structure including a plurality of test levels, each higher test level comprising one or more lower test levels and said instructions to display include instructions to display an indicator corresponding to each said higher test level, said indicator indicating how many of said lower test levels have been or are to be executed.

8. The product of claim 7 wherein said instructions to display an indicator comprise instructions to display an icon, the brightness of which provides said indication.

9. The product of claim 7 wherein said test levels include a Procedure level, a Test level, a Measurement level, and a Datapoint level.

10. A method of operating a test executive system for controlling tests upon a device under test that is distinct and separate from said test executive system, said method comprising:

displaying a plurality of run selection choices, each said run selection choice corresponding to a different set of tests, said plurality of run selection choices comprising at least two of the choices selected from the group consisting of "run all tests", "run marginal tests", "run failed tests"; "run erroneous tests", "run selected tests", and combinations thereof;

receiving an input identifying one of said run selection choices;

executing tests of said device under test indicated by said run selection choice; and displaying results of said executed tests, wherein said controlled tests have a hierarchial structure including a plurality of test levels, each higher test level comprising one or more lower test levels and said method further comprises displaying an indicator corresponding to each said higher test level, said indicator indicating how many of said lower test levels have been or are to be executed, and said plurality of test levels include a Procedure level, a Test level, a Measurement level, and a Datapoint level.

11. The method of claim 10 wherein said act of displaying a plurality of run selection choices comprises displaying one or more of the following selection choices; "run all tests", "run marginal/failed tests", and "run selected tests".

12. The method of claim 10 wherein said method further includes:

displaying tests available to run;

receiving an input for a test to run; and updating a list of tests to run with said test.

13. The method of claim 12 wherein said act of updating comprises the act of updating a display to indicate said test is selected.

14. The method of claim 13 and further including the act of receiving an input to deselect said test and updating said display to indicate said test is removed from said list of tests.

15. The method of claim 10, wherein said plurality of run selection choices comprises at least three of the choices selected from the group consisting of "run all tests", "run marginal tests", "run failed tests"; "run erroneous tests", "run selected tests", and combinations thereof.

16. A test executive system for controlling tests upon device under test that is distinct and separate from said test executive system comprising:

a display for showing a plurality of run selection choices, each said run selection choice corresponding to a different set of tests, said plurality of run selection choices comprising at least two of the choices selected from the group consisting of "run all tests", "run marginal tests", "run failed tests"; "run erroneous tests", "run selected tests ", and combinations thereof;

a memory storing information capable of selecting tests corresponding to each of said run selection choices; and a processor for receiving an input identifying one of said run selection choices and communicating with said memory for executing tests on said device under test indicated by said run selection choice, wherein said controlled tests have a hierarchial structure including a plurality of test levels, each higher test level comprising one or more lower test levels and said method further comprises displaying an indicator corresponding to each said higher test level, said indicator indicating how many of said lower test levels have been or are to be executed, and said plurality of test levels include a Procedure level, a Test level, a Measurement level, and a Datapoint level.

17. A test executive system as in claim 16 wherein said run selection choices comprise two or more of the following selection choices: "run all tests", "run marginal/failed tests", and "run selected tests".

18. The test executive system of claim 16, wherein said plurality of run selection choices comprises at least three of the choices selected from the group consisting of "run all tests", "run marginal tests", "run failed tests"; "run erroneous tests", "run selected tests", and combinations thereof.

19. A product that provides a test executive system for controlling tests upon a device under test that is distinct and separate from said test executive system, said product comprising:
   instructions for directing a processing unit to:
   display a plurality of run selection choices, each said run selection choice corresponding to a different set of tests; said plurality of run selection choices comprising at least two of the choices selected from the group consisting of "run all tests", "run marginal tests", "run failed tests"; "run erroneous tests", "run selected tests", and combinations thereof;
   receive an input identifying one of said run selection choices;
   execute tests of said device under test indicated by said run selection choice;
   display results of said executed tests; and
   a media readable by said processing unit that stores said instructions;
   wherein said controlled tests have a hierarchial structure including a plurality of test levels, each higher test level comprising one or more lower test levels and said method further comprises displaying an indicator corresponding to each said higher test level, said indicator indicating how many of said lower test levels have been or are to be executed, and said plurality of test levels include a Procedure level, a Test level, a Measurement level, and a Datapoint level.

20. The product of claim 19 wherein said instructions further comprise instructions for directing said processing unit to determine whether said run selection choice is "run all tests".

21. The product of claim 19 wherein said instructions further comprise instructions for directing said processing unit to determine whether said run selection choice is "run selected tests".

22. The product of claim 21 wherein said instructions to execute said test comprise:
   instructions for directing said processing unit to:
   receive input of selection of a specific test to execute; and
   execute said specific test.

23. The product of claim 22 wherein said instructions to receive said input comprises:
   instructions for directing said processing unit to:
   display tests available to run;
   receive test input corresponding to one or more of said available tests; and
   update a list of tests to run.

24. The product of claim 23 wherein said instructions to update comprise instructions for directing said processing unit to update a display to indicate said test is selected.

25. The product of claim 23 wherein said instructions to update further comprises instructions for directing said processing unit to save said list of tests in a file responsive to receiving said finish input.

26. The product of claim 23 wherein said instructions to receive test input further comprises:
   instructions for directing said processing unit to:
   receive a remove input to remove said test from said list; and
   remove said test from said list responsive to receiving said remove input.

27. The product of claim 26 wherein said instructions to receive remove input further comprises instructions for directing said processing unit to update a display to indicate said test is removed from said list.

28. The product of claim 19 wherein said instructions to display an indicator comprise instructions to display an icon, the brightness of which provides said indication.

* * * * *